United States Patent
Nakano et al.

[11] Patent Number: 5,866,304
[45] Date of Patent: Feb. 2, 1999

[54] PHOTOSENSITIVE RESIN AND METHOD FOR PATTERNING BY USE OF THE SAME

[75] Inventors: Kaichiro Nakano; Shigeyuki Iwasa; Etsuo Hasegawa, all of Tokyo, Japan

[73] Assignee: NEC Corporation, Tokyo, Japan

[21] Appl. No.: 896,094

[22] Filed: Jul. 17, 1997

Related U.S. Application Data

[62] Division of Ser. No. 364,486, Dec. 27, 1994, Pat. No. 5,738,975.

[30] Foreign Application Priority Data

Dec. 28, 1993 [JP] Japan .................................. 5-334613

[51] Int. Cl.$^6$ .................................. G03F 7/30; G03F 7/40
[52] U.S. Cl. .......................... 430/325; 430/326; 430/330
[58] Field of Search .................................. 430/325, 326, 430/330

[56] References Cited

U.S. PATENT DOCUMENTS

| | | | |
|---|---|---|---|
| 3,772,062 | 11/1973 | Shur ...................................... | 117/93.31 |
| 5,372,912 | 12/1994 | Allen et al. ........................... | 430/270.1 |
| 5,474,872 | 12/1995 | Tomo et al. .......................... | 430/270.1 |
| 5,580,694 | 12/1996 | Allen et al. ........................... | 430/270.1 |
| 5,580,695 | 12/1996 | Murata et al. ........................ | 430/270.1 |

FOREIGN PATENT DOCUMENTS

| | | |
|---|---|---|
| A2 27660 | 6/1990 | Japan . |
| A4226461 | 8/1992 | Japan . |
| A4230758 | 8/1992 | Japan . |
| A5 80516 | 4/1993 | Japan . |
| A5134416 | 5/1993 | Japan . |
| A5257284 | 10/1993 | Japan . |
| A5265212 | 10/1993 | Japan . |
| A5346668 | 12/1993 | Japan . |
| A6208028 | 7/1994 | Japan . |

OTHER PUBLICATIONS

Fujitsu Ltd, 93–397641, English Equivalent Abstract of JP–05–265212, Dated Oct. 15, 1993, From Derwent Information Ltd.

Kaimoto et al, 120:232105, English Equivalent Abstract of JP–05–265212 A2 Dated Oct. 15, 1993, From Chemical Abstracts, Amrican Chemical Society.

(List continued on next page.)

*Primary Examiner*—Cynthia Hamilton
*Attorney, Agent, or Firm*—Sughrue, Mion, Zinn, Macpeak & Seas, PLLC

[57] ABSTRACT

The invention provides a photosensitive resin which includes polymer including a group which reacts with an acid to thereby convert a polarity thereof, a photo acid generator which is responsive to radial rays to thereby generate an acid, and a solvent in which the polymer and the photo acid generator is soluble. The polymer is a terpolymer represented by a following general formula (I) wherein n represents a positive integer ranging from 5 to 1000 both inclusive, $R^4$ is a group selected from a group consisting of a tricyclodecanyl group, a dicydopentenyl group, a dicyclopentenyloxyethyl group, a cyclohexyl group, a norbonyl group, a norbornaneepoxy group, a norbornaneepoxymethyl group and an adamantyl group, $R^5$ is a group selected from a group consisting of a tetrahydropyranyl group, a tetrahydrofuranyl group, a methyl group, an ethyl group, a propyl group, a tert-butyl group and 3-oxocyclohexyl group, and $x+y+z=1$ in which x is a variable in the range from 0.1 to 0.9 both inclusive, y is a variable in the range from 0.1 to 0.7 both inclusive, and z is a variable in the range from 0.01 to 0.7 both inclusive.

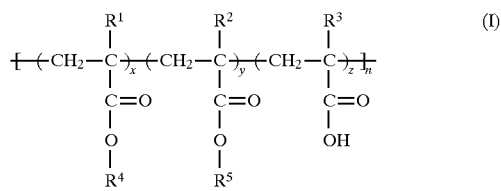

4 Claims, 4 Drawing Sheets

OTHER PUBLICATIONS

Nozaki et al, 121:241816, English Equivalent Abstract of JP 05-346668 A2. Dated Dec. 27, 1993, From Chemical Abstracts, American Chemical Society.

R. Allen et al., "Single Layer Resists with Enhanced Etch Resistance for 193 nm Lithography", *Journal of Photopolymer Science and Technology*, vol. 7, No. 3 (1994) pp. 507–516.

T. Ueno et al., "Chemical Amplification Positive Resist Systems Using Novel Sulfonates as Acid Generators", *Proceedings of PME '89*, 1990, pp. 413–424.

T. Neenan et al., "Chemically Amplified Resists: A Lithographic Comparison of Acid Generating Species," *SPIE Proceedings*, vol. 1086 (1989), pp. 2–10.

J. Crivello et al., "A New Preparation of Triarylsulfonium and –selenium Salts via the Copper(II)–Catalyzed Arylation of Sulfides and Selenides with Diaryliodonium Salts", *J. Org. Chem.*, vol. 43, No. 15 (1978), pp. 3055–3058.

M. Rothschild et al., "A Review of Excimer Laser Projection Lithography", *J. Vac. Sci. Technol.*, B 6(1), (1988), pp. 1–17.

S. Takechi et al., "Alicyclic Polymer for ArF and KrF Excimer Resist Based on Chemical Amplification", *Journal of Photopolymer Science and Technology*, vol. 5, No. 3 (1992), pp. 439–446.

M. Sasago et al., "ArF Excimer Laser Lithography (3) Evaluation of Resist", 35*th Applied Physics Institution Conference Manuscripts*, 1989, pp. 1p–K–4.

H. Ito et al., Applications of Photoinitiators to the Design of Resists for Semiconductor Manufacturing, *Polymers in Electronics*, 1984, pp. 11–23.

Ueno et al., "Short Wavelength Photoresist Material—Minuter Processing for ULSI", Bunshin Shuppan, publisher, 1988, pp. 4–21.

PHOTOSENSITIVE RESIN AND METHOD FOR PATTERNING BY USE OF THE SAME

This is a divisional of application Ser. No. 08/364,486 filed Dec. 27, 1994 now U.S. Pat. No. 5,738,975.

BACKGROUND OF THE INVENTION

1. Field of the Invention

The invention relates to a photosensitive resin and a method for patterning a substrate by use of the photosensitive resin, and more particularly to such a photosensitive resin and method suitable when far ultraviolet radiation (FUV) having a wavelength equal to or smaller than 220 nm is to be used as an exposure light.

2. Description of the Related Art

In a field of manufacturing various electronic devices such as VLSI which require minute processing in a sub-micron order, an electric device now must be more highly densified and integrated. Thus, an improved lithography technique is required for forming a minute pattern on a substrate.

One known method for forming a minute pattern is a method in which an exposure light having a shorter wavelength is used for forming a resist pattern. This method is based on Rayleigh's equation representing a resolution R or a line width of an optical system. Rayleigh's equation is $$R = k\lambda/NA$$

wherein $\lambda$ represents a wavelength of an exposure light, NA is a numerical aperture of a lens, and k is a process factor. It can be understood from Rayleigh's equation that a wavelength $\lambda$ of an exposure light must be shorter in order to accomplish a higher resolution or obtain a smaller R.

For instance, an i-line which has a wavelength of 365 nm and is irradiated from a high-pressure mercury vapor lamp has been used as a light source for manufacturing a dynamic random access memory (DRAM) having an integration equal to or smaller than 64M bits. It is said that the i-line may be replaced as an exposure light source with KrF excimer laser having a wavelength of 248 nm in mass production process of 256 bits DRAM which requires a processing dimension smaller than 0.25 $\mu$m. It is being studied presently to use a light source having a shorter wavelength for the purpose of manufacturing DRAM having an integration higher than 1G bit which requires a processing dimension to be smaller than 0.2 $\mu$m. For that purpose, an excimer laser such as KrCl having a wavelength of 222 nm, ArF having a wavelength of 193 nm and $F_2$ having a wavelength of 157 nm, electron beam and X-ray are considered useful according to the book "Short Wavelength Photoresist Material—Minuter Processing for ULSI" authored by Takumi Ueno, Takao Iwayanagi, Saburo Nonogaki, Hiroshi Ito and C. Grant Wilson, 1988, published through Bunshin Shuppan.

However, in view of both a target yield of mass production, in other word, a period of time for an exposure step, and an economical efficiency to be obtained when a novel light source is to be used, a photolithography technique is considered to be most useful because it can expose all objects to light at one time and much experience about the photolithography technique have been accumulated. Thus, it is necessary to develop photolithography technique which uses a light having a shorter wavelength than KrF excimer laser, that is, a light having a wavelength equal to or shorten than 220 nm. It is expected that such a technique will significantly affect a future process of manufacturing electronic devices.

An excimer laser as a light source suffers from many problems, including the short lifetime of gas from which the laser is to be irradiated and the expense of the laser irradiation apparatus. Thus, when an excimer laser is to be used as a light source in mass production of electronic devices, it is necessary to improve cost performance of the laser. Accordingly, resist material for minute processing must have a high sensitivity as well as to have a high resolution in response to more minute processing dimensions.

One known method for enhancing a sensitivity of resist is a chemically amplified resist which utilizes a photo acid generator as a sensitizer. For instance, Japanese Unexamined Patent Public Disclosure No. 2-27660 has suggested a resist comprising a combination of triphenyl-sulfonium-hexafluoro-arsenate and poly(p-tertbutoxycarbonyloxystyrene-co-α-methylstyrene). There are many reports about a chemically amplified resist as KrF excimer laser resist, for instance, in American Chemical Society Symposium Series, 1984, Vol. 242, pages 11–23, reported by Hiroshi Ito and C. Grant Willson. A chemically amplified resist is characterized by the steps of transferring proton acid, which is generated by a photo acid generator which is one of constituents of the resist, through a resist solid phase by means of post-exposure heat treatment, and amplifying chemical reaction of a resist resin due to the proton acid in a way like catalytic action up to hundreds of to thousands of times. Thus, a much higher sensitivity can be obtained relative to a prior resist which has an optical reaction efficiency, which is defined by reaction per a photon, smaller than one (1).

Presently, most newly developed resists are chemical amplified resists, and hence a chemical amplification system must be adopted in development of a high sensitive material in response to a shorter wavelength of an exposure light source.

However, if a chemically amplified resist for use with a single layer which is now widely used is to be used with an exposure light having a wavelength shorter than 220 nm for forming a minute pattern, for instance, ArF excimer laser having a wavelength of 193 nm, in general the resist intensively absorbs the exposure light. It is known that a commercially available resist would absorb most of the incident light at a surface thereof to which the light is directed, and hence the light could scarcely reach a substrate, thereby it is impossible to resolve a pattern on a substrate. Such a fact is reported, for instance, in "ArF excimer laser lithography (3)—Evaluation of Resist—", the 35th Applied Physics Institution Conference Manuscripts, 1989, 1p-K-4 by Sasago et al. Thus, in lithography having a light source comprising ArF excimer laser which is expected to be a post KrF light source, it is well known that a presently used resist cannot resolve a pattern at all.

Both a novolac resin which is a polymer in most presently used resists for use with i-line, and poly(p-vinylphenol) which is widely used as a base polymer of chemically amplified resist used for exposing a pattern with KrF excimer laser, have an aromatic ring in their molecular structure. This is because the molecular structure of a resin has to contain a lot of unsaturated bond, which is a quite strong bond, for providing a resist with resistance during a dry-etching step which is to be carried out after a pattern would have been formed in a semiconductor manufacturing process. The aromatic ring functions to achieve that purpose. Poly(p-vinylphenol) widely used in a resist for use with KrF excimer laser is transparent to KrF excimer laser.

Specifically, poly(p-vinylphenol) has a transmittance of about 70% when it has a thickness of 1 μm. However, poly(p-vinylphenol) intensively absorbs a light having a shorter wavelength because of an aromatic ring present in a molecular structure thereof. Thus, it is impossible to use poly(p-vinylphenol) as a lithography resist using an exposure light having a shorter wavelength, more specifically a wavelength equal to or shorter than 220 nm.

A resin which is transparent to a light having a wavelength equal to or shorter than 220 nm includes polyacryl family resin and poly(methylmethacrylate), which is hereinbelow to be referred simply as PMMA, both of which have no aromatic rings. For instance, it has been reported that a resolution of 0.13 μm could be obtained by means of a stepper with ArF excimer laser using a thin PMMA film having a thickness of 0.15 μm, in Journal of Vacuum Science and Technology, 1988, Vol. B6, page 1, by M. Rothschild et al.

Therefore, a polymer can be transparent to a light having a wavelength shorter than 220 nm by removing aromatic rings out of its resin structure, but, the polymer cannot obtain a sufficient resistance against a dry-etching step. Accordingly, it is impossible to use PMMA not having a sufficient dry-etching resistance as a resist to be used in electronic elements manufacturing process. There has been reported a polymer having an alicyclic alkyl group as an attempt for solving the above mentioned problem.

For instance, there has been reported a copolymer having an adamantylmethacrylate unit which is an alicyclic polymer as a polymer having a transparency to a light having a wavelength of 193 nm and further being dry-etching resistant, in Journal of Photopolymer Science and Technology, 1992, Vol. 5, No. 3, pages 439–446, by Takechi et al. and Japanese Unexamined Patent Public Disclosure No. 5-265212. For another instance, poly (norbonylmethacrylate) has been reported as a polymer having a transparency to a light having a wavelength of 193 nm and further being dry-etching resistant, in Proceedings of IEDM, 1992, CA14-18, San Francisco by M. Endo et al.

However, these methacrylic polymers both having an alicyclic alkyl group have a high hydrophobic property because an alicyclic group and further a protection group (a polarity converting group) both present in a polymer are hydrophobic. Consequently, a thin film composed of these polymers has a weak adhesion with a silicon substrate, and hence it is quite difficult to repeat the formation of uniform films. Furthermore, it is considered that such a thin film would have three problems as stated below, and hence would be difficult to use in a semiconductor manufacturing process.

1. Since a resist has a weak adhesion with a substrate, a pattern may be peeled off from a substrate or may be collapsed during or after a developing step. Thus, it is impossible to repeat the formation of the same patterns.
2. Since a resin has a strong resistance against a presently used alkaline developing reagent, it is impossible to obtain a sufficient sensitivity required for resolving a pattern. Furthermore, scum tends to be generated.
3. Since the above mentioned methacrylic polymer has a weak affinity with a solvent, (a) it is difficult to form a uniform layer, (b) a resin tends to precipitate out of a resist solvent, and (c) such precipitated materials cause a clean room and a wafer to be contaminated.

Though some reports have mentioned a polymer for use with lithography in which a light having a wavelength equal to or shorter than 220 nm is to be used, it is difficult for the above mentioned reasons to actually use a resist composed of a resin containing alicyclic alkyl groups therein in a semiconductor manufacturing process.

SUMMARY OF THE INVENTION

It is an object of the present invention to provide a chemically amplified resist having high sensitivity, resolution and dry-etching resistance to a ultra-far ultraviolet radiation (FUV) and usable in a semiconductor manufacturing process, and it is also an object of the invention to provide a method for patterning a substrate in which method a minute pattern can be formed by virtue of the above mentioned resist.

The inventors have studied the above mentioned problems and discovered that the above mentioned problems can be solved by a photosensitive resin containing a polymer having a terpolymer structure as mentioned later and a patterning method characterized by that a substrate is to be patterned by irradiating a light thereto using the above mentioned photosensitive resin. The present invention is based on the discovery.

Specifically, acrylate or methacrylate carboxylic acid monomer having a hydroxyl group (—OH) is introduced into a resin for enhancing a hydrophilic property of the resin, to thereby convert the resin into a terpolymer. As a result, the above mentioned problems can be solved.

The three ingredients are as follows.

1. Monomer having an alicyclic alkyl group such as dicyclopentenyl group and tricyclodecanyl group, and an alicyclic epoxy group such as norbornaneepoxy group.
2. Monomer having a group which is cleaved by an acid to thereby induce polarity-conversion, such as tetrahydropyranyl group.
3. Monomer selected from a group consisting of acrylate carboxylic acid and methacrylate carboxylic acid.

The invention provides a photosensitive resin including (a) polymer including a group which reacts with an acid to thereby convert a polarity thereof, (b) a photo acid generator which is responsive to radiation to thereby generate an acid, and (c) a solvent in which the polymer and the photo acid generator is soluble. The polymer is a terpolymer represented by a following general formula (I) wherein n represents a positive integer ranging from 5 to 1000 both inclusive, preferably in the range from 10 to 200 both inclusive, $R^1$, $R^2$ and $R^3$ each represents a hydrogen atom or a methyl group, $R^4$ is a group selected from a group consisting of a tricyclodecanyl group, a dicyclopentenyl group, a dicyclopentenyloxyethyl group, a cyclohexyl group, a norbonyl group, a norbornaneepoxy group, a norbornaneepoxymethyl group and an adamantyl group, $R^5$ is a group selected from a group consisting of a tetrahydropyranyl group, a tetrahydrofuranyl group, a methyl group, an ethyl group, a propyl group, a tert-butyl group and 3-oxocyclohexyl group, and x+y+z=1 in which x is a variable in the range from 0.1 to 0.9 both inclusive, preferably in the range from 0.3 to 0.7 both inclusive, y is a variable in the range from 0.1 to 0.7 both inclusive, preferably in the range from 0.3 to 0.5 both inclusive, and z is a variable in the range from 0.01 to 0.7 both inclusive, preferably in the range from 0.05 to 0.3 both inclusive.

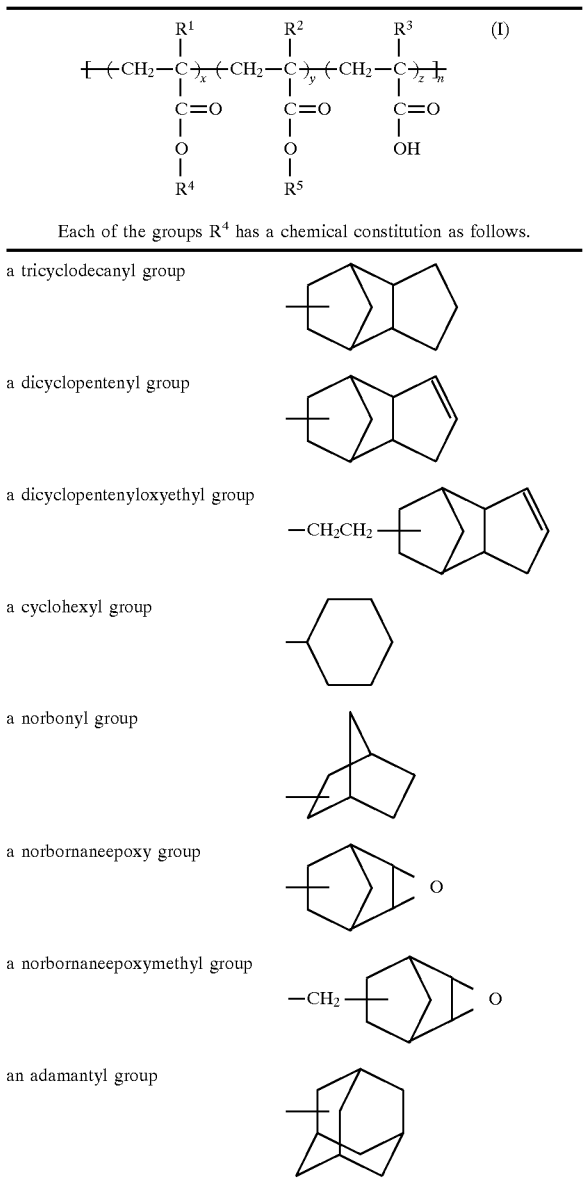

Each of the groups $R^4$ has a chemical constitution as follows.

a tricyclodecanyl group a dicyclopentenyl group a dicyclopentenyloxyethyl group a cyclohexyl group a norbonyl group a norbornaneepoxy group a norbornaneepoxymethyl group an adamantyl group The polymer which is a constituent of the photosensitive resin includes any polymer which is transparent to a far ultraviolet radiation having a wavelength equal to or shorter than 220 nm and which has a group unstable to an acid.

In a preferred embodiment, the polymer includes a plurality of terpolymers represented by the general formula (I).

In another preferred embodiment, the polymer has a polystyrene equivalent molecular weight (Mw) measured with GPC in the range of 4000 to 100000 both inclusive.

In still another preferred embodiment, the polymer has a polystyrene equivalent molecular weight (Mw) measured with GPC in the range of 8000 to 20000 both inclusive.

As conventional examples of a chemically amplified resist containing copolymer composed of three or more kinds of monomers, there are a resist to apply to liquid disclosed in Japanese Unexamined Patent Public Disclosure No. 4-226461, and a dry film type resist disclosed in Japanese Unexamined Patent Public Disclosure No. 4-230758. However, these resists are to be used when a circuit board is manufactured. On the other hand, monomer such as methacrylate and acrylic acid to be used in copolymerization is introduced to a resin for the purpose of enhancing properties of a resin such as a mechanical strength by controlling a glass transition point of entire resin. In addition, both terpolymer such as methylmethacrylate/3-butylmethacrylate/methacrylic acid shown in the embodiment of the former Japanese Unexamined Patent Public Disclosure and quaterpolymer such as ethylacrylate/3-butylmethacrylate/methylmethacrylate/acrylic acid shown in the embodiment of the latter Japanese Unexamined Patent Public Disclosure have a weak dry-etch resistance, and hence it is obvious that these polymers are not applicable to a process for manufacturing an electronic device such as a memory such as DRAM.

The photosensitive resin in accordance with the invention basically includes a polymer, a photo acid generator and a solvent.

In yet another preferred embodiment, the photo acid generator generates an acid under a light having a wavelength equal to or less than 400 nm.

In still yet another preferred embodiment, the photo acid generator generates an acid under a light having a wavelength equal to or less than 220 nm.

In the invention, any photo acid generator may be used if a combination of the polymer and the photo acid generator is sufficiently soluble in an organic solvent, and if it is possible to form a uniform layer composed of a solution of the photo acid generator with a layer forming process such as spin coating. The photo acid generator may include a plurality of kinds of photo acid generators.

Photo acid generators usable in the photosensitive resin may be selected, for instance, from any one of (a) triphenylsulfonium salt derivatives disclosed in Journal of the Organic Chemistry, 1978, Vol. 43, No. 15, pages 3055–3058, by J. V. Crivello, (b) onium salts such as sulfonium salt, iodonium salt, diazonium salt and ammonium salt, (c) 2,6-dinitrobenzylester disclosed in SPIE Proceedings, 1989, Vol. 1086, pages 2–10, by T. X. Neenan et al., (d), 1,2,3-tri(methanesulfonyloxy)benzene shown in Proceedings of PME '89, 1990, pages 413–424, reported by Takumi Ueno et al. and published through Kodansha, and (e) sulfosuccinimide disclosed in Japanese Patent Public Disclosure No. 5-134416.

In further preferred embodiment, the photo acid generator has a general formula (II) wherein $R^1$ and $R^2$ are straight-chain, branching or cyclic alkyl groups, $R^3$ is a straight-chain, branching or cyclic alkyl group, or a 2-oxocyclicalkyl group, or a 2-oxostraight-chain or branching alkyl group, and Y-represents a twin ion such as $BF_4$—, $AsF_6$—, $SbF_6$—, $PF_6$—, $CF_3COO$—, $ClO_4$—, and $CF_3SO_3$—.

In further preferred embodiment, the photo acid generator has a general formula (III) wherein $R^1$ is a hydrogen or a straight-chain, branching or cyclic alkyl group, $R^2$ is a hydrogen or a straight-chain, branching or cyclic alkyl group, $R^3$ is a hydrogen, or a straight-chain, branching or cyclic alkyl group, or a haloalkyl group such as perfluoroalkyl.

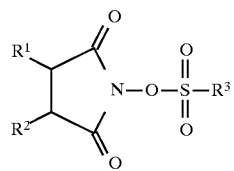

The photo acid generator such as triphenylsulfonium tifluoromethanesulfonate (TPS) presently, widely used for KrF excimer laser lithography has a quite strong light-absorbing property in the range of far ultraviolet radiation (FUV) having a wavelength equal to or shorter than 220 nm, and hence it is required to limit an amount thereof if it is to be used as a photo acid generator in the invention. Now comparing a transmittance at a wavelength of 193.4 nm which is a main wavelength of ArF excimer laser, a transmittance of a PMMA film (1 μm thick) containing TPS at 1.5% by weight on the basis of a total weight of the film is approximately 40%, and a transmittance of a PPMA film containing TPS at 5.5% by weight is 6%. On the other hand, a transmittance of a PMMA film containing, for instance, cyclohexylmethyl(2-oxocyclohexyl)sulfoniumtrifluoromethanesulfonate,which is one of sulfonium salts derivatives shown with the formula (II), at 5% by weight is 73.0%, and at 30% by weight was 57.0%, both of which were higher than the former transmittance. A transmittance of a PMMA film containing, for instance, N-hydroxysucciimidetrifluoromethanesulfonate, which is one of photo acid generators shown with the formula (III), at 5% by weight was 50.0%. Thus, any of photo acid generators shown with the formulas (II) and (III) absorbs quite little amount of light in the band of FUV having a wavelength ranging from 185.5 nm to 220 nm, and accordingly it is obvious that they are preferable for a constituent of a resist to be used for ArF excimer laser lithography in terms of transparency to a light for exposing. Specifically, a photo acid generator may be selected from any one of cyclohexylmethyl(2-oxocyclohexyl)sulfoniumtrifluoromethanesulfonate, dicyclohexyl(2-oxocyclohexyl)sulfoniumtrifluoromethanesulfonate, dicyclohexylsulfonylcyclohexanone, dimethyl(2-oxocyclohexyl)sulfoniumtrifluoromethanesulfonate, triphenylsulfoniumtrifluoromethanesulfonate, diphenyliodoniumtrifluoromethanesulfonate, and N-hydroxysucciimidetrifluoromethanesulfonate. However, it should be noted that a photo acid generator to be used in the invention is not to be limited to those, and any other photo acid generator may be selected.

A single kind of or a plurality of kinds of photo acid generator(s) may be used in the photosensitive resin in accordance with the invention. The photo acid generator is contained by weight percent preferably in the range from 0.5 to 25 both inclusive, and more preferably in the range from 3 to 15 both inclusive. If a content rate of the photo acid generator would be lower than 0.5% by weight, the photosensitive resin could have only quite a small sensitivity, and hence the formation of a pattern is difficult. On the other hand, if a content rate of the photo acid generator would be higher than 25% by weight, it would be difficult to form a uniform layer, and further there would be posed a problem that scum tends to be generated after development of a pattern.

Any organic solvent may be used in the invention, if a constituent thereof composed of polymer and alkylsulfonium salt would be sufficiently soluble in the solvent, and it would be possible to form a uniform layer of the solution with a method such as spin coating process. A single kind of solvent or a plurality of kinds of solvents may be used. Specifically, a solvent to be used in the invention is selected from any one of n-propylalcohol, isoproplyalcohol, n-butylalcohol, tert-butylalcohol, methylcellosolveacetate, ethylcellosolveacetate, propyleneglycolmonoethyletheracetate, methyl lactate, ethyl lactate, 2-methoxybutyl acetate, 2-ethoxyethyl acetate, pyrubic acid methyl, pyrubic acid ethyl, 3-methoxypropionatemethyl, 3-methoxypropionate ethyl, N-methyl-2-pyrrolidinone, cyclohexanone, cyclopentanone, cyclohexanol, methylethylketone, 1,4-dioxan, ethyleneglycol, monomethylether, ethyleneglycolmonomethyletheracetate, ethyleneglycolmonoethylether, ethyleneglycolmonoisopropylether, diethylenegylcolmonomethylether, and diethyleneglycoldimethyether. It should be noted that a solvent to be used in the invention is not to be limited to the above mentioned ones.

As having been explained, basic constituents of the photosensitive resin in accordance with the invention are the above mentioned alkylsulfonium salt compound, polymer and solvent. However, the photosensitive resin may include other constituents such as surfactant, pigment, stabilizer, reagent for enhancing application property, and dye.

A developing solution to be used when a minute pattern is to be used in accordance with the invention may be selected from any one of an organic solvent to be selected in accordance with solubility of polymer to be used in the invention, a mixture solvent containing the organic solvent, alkaline solution, alkaline aqueous solution or a mixture thereof each having a suitable concentration, and a mixture of the alkaline solution, organic compound and organic solvent. The organic solvent and organic compound to be used may be selected from any one of (a) ketone such as acetone, methyl ethyl ketone, methyl isobutyl ketone, cyclopentanone, cyclohexane, 2,6-dimethylcyclohexanone, and 3-methyl-2-cyclopentanone, (b) alcohol such as methyl alcohol, ethyl alcohol, n-propyl alcohol, isopropyl alcohol, n-butyl alcohol, isobutyl alcohol, tert-butyl alcohol, cyclopentanol, cyclohexanol, 2-methylcyclohexanol, 1,4-cyclohexanedimethanol, 1,4-cyclohexanediol, and (c) any other organic solvents such as tetrahydrofuran, dioxane, ethyl acetate, butyl acetate, isoamyl acetate, benzene, toluene, xylene, phenol, acetonitrile, and dimethylformamide. The alkaline solution to be used may be selected from any one of (a) inorganic alkali such as sodium hydroxide, potassium hydroxide, sodium silicate, and ammonia, (b) organic amine such as ethyl amine, propyl amine, diethyl amine, dipropyl amine, trimethyl amine, and triethyl amine, (c) an aqueous solution or an organic solvent each containing organic ammonium salt such as tetramethylammoniumhydroxyde, tetraethylammoniumhydroxyde, trimethylhydroxymethlammoniumhydroxyde, triethylhydroxymethylammoniumhydroxyde, and trimethylhydroxyethylammoniumhydroxyde, or a combination thereof.

The invention also provides a method for patterning a substrate, including the steps of (A) forming a thin film on a substrate, the thin film being composed of photosensitive resin, the photosensitive resin including (a) polymer including a group which reacts with an acid to thereby convert a polarity thereof, (b) a photo acid generator which is responsive to radial rays to thereby generate an acid, and (c) a solvent in which the polymer and the photo acid generator is soluble, the polymer being a terpolymer represented by a following general formula (I) wherein n represents a positive integer ranging from 5 to 1000 both inclusive, $R^1$, $R^2$ and $R^3$ each represents a hydrogen atom or a methyl group, $R^4$ is a group selected from a group consisting of a tricyclodecanyl group, a dicyclopentenyl group, a dicyclopentenyloxyethyl group, a cyclohexyl group, a norbonyl group, a norbornaneepoxy group, a norbornaneepoxymethyl group and an adamantyl group, $R^5$ is a group selected from a group consisting of a tetrahydropyranyl group, a tetrahydrofuranyl group, a methyl group, an ethyl group, a propyl group, a tert-butyl group and 3-oxocyclohexyl group, and $x+y+z=1$ in which x is a variable in the range from 0.1 to 0.9 both inclusive, preferably in the range from 0.3 to 0.7 both inclusive, y is a variable in the range from 0.1 to 0.7 both inclusive, preferably in the range from 0.3 to 0.5 both inclusive, and z is a variable in the range from 0.01 to 0.7 both inclusive, preferably in the range from 0.05 to 0.3,

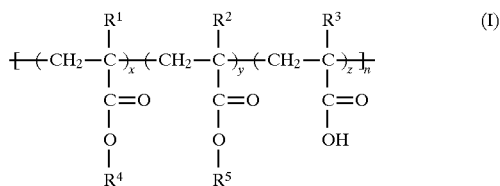

(B) exposing a selected region of the thin film to light having a wavelength equal to or less than 220 nm, (C) heating the selected region of the thin film, and (D) developing the selected region of the thin film.

In a preferred embodiment, the light for exposure is ArF excimer laser light.

In another preferred embodiment, the polymer has a polystyrene equivalent molecular weight (Mw) in the range of 8000 to 20000 both inclusive.

In still another preferred embodiment, the photo acid generator is contained by weight percent in the range from 0.5 to 25 both inclusive.

The invention operates as follows. First, a coating layer is formed of the photosensitive resin in accordance with the invention. Then, by exposing the layer to far ultraviolet radiation (FUV) such as ArF excimer laser, a photo acid generator containing in an exposed area of the layer generates acid.

For instance, when a resin having a structure shown in the formula (I) wherein tetrahydropyranyl group is to be used as $R^5$ is used, a proton acid generated by FUV induces chemical reaction in the tetrahydropyranyl group contained in the resin in accordance with a reaction formula (IV). As a result of the chemical reaction, a carboxylic acid group is generated, and thus there is caused a change in solubility of a resist.

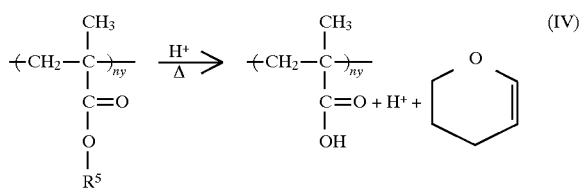

By carrying out post exposure bake, a reaction in which the protection groups are removed occurs like a catalytic reaction, and thereby a sensitivity is amplified. The reaction converts functional groups present in the exposed area of the resin to hydroxyl group, and thereby the resin becomes soluble in alkali. Accordingly, a developing solution containing alkali or alcohol could melt the exposed area of the resin to thereby form a positive type pattern. To the contrary, a developing solution containing ethyl acetate or ketone could form a negative type pattern.

The inventors confirmed, as shown in the later mentioned embodiments, that the photosensitive resin in accordance with the invention could form a minute rectangular pattern with high sensitivity in a resolution experiment using ArF excimer laser for exposing a resin thereto.

Namely, the photosensitive resin in accordance with the invention can be used as a photoresist for the formation of a minute pattern in a lithography technique in which FUV having a wavelength equal to or shorter than 220 nm is to be used for exposing a resin thereto.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1A:
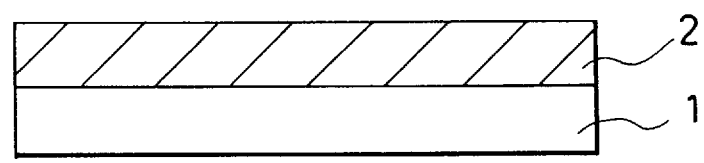
FIGS. 1A, 1B and 1C shows steps of a method for forming a positive type pattern composed of a photosensitive resin in accordance with the invention.

Preferred embodiments in accordance with the present invention will be explained hereinbelow with reference to drawings.

[Embodiment 1]

Synthesis of Poly(tricyclodecanylmethacrylate-co-tetrahydropyranylmethacrylate-co-methacrylic acid In 300 ml eggplant-shaped flask having three stop cocks, followings are dissolved in 80 ml of dry tetrahydrofuran in argon gas atmosphere.

A. 15 grams (equivalent to 0.068 mol) of tricyclodecanylmethacrylate commercially available from Hitachi Kasei under the tradename of "FA-513A". Hereinbelow, tricyclodecanylmethacrylate will be referred to simply as TCDMA.

B. 11.58 grams (equivalent to 0.068 mol) of tetrahydropyranylmethacrylate which hereinbelow will be referred to simply as THPMA. THPMA was synthesized in accordance with a conventional method reported by G. N. Taylor et al. in Chemistry Material, 1991, Vol. 3(6), pages 1031–1040.

C. 2.94 grams (equivalent to 0.034 mol) of methacrylic acid which hereinbelow will be referred to as simply as MAA. A mixture ratio of TCDMA, THPMA and MAA was 40:20:20. To the solution was added 0.918 grams (equivalent to 0.0056 mol) of azobisisobutyronitrile, a polymerization initiator, dissolved in 30 ml of tetrahydrofuran solution, and then the solution was heated at 60–70 degrees centigrade for an hour. Then, the solution was introduced into 1 liter of hexane. Reprecipitation was twice repeated. Precipitation of polymer was collected through a filter, and then the precipitation was depressurized and dried under 2 mmHg at 40 degrees centigrade for 24 hours. Thus, there was obtained 15.0 grams of white-colored powder of poly (TCDMA-co-THPMA-co-MAA). The yield was 50.8%. The copolymerization ratio was the same as the mixture ratio of TCDMA, THPMA and MAA. The copolymerization ratio was measured with $^1$H-NMR measurement process. The polystyrene equivalent molecular weight was 49600, and the degree of dispersion was 2.17. IR (KBr tablet, cm$^{-1}$) 1722 ($v_{c=o}$)

| Elemental Analysis | C | H |
|---|---|---|
| measured value | 69.80 | 8.82 |
| theoretical value | 69.30 | 8.61 |

[Embodiment 2]

Synthesis of Poly(TCDMA-co-tert-butylmethacrylate-co-MAA)

In 300 ml eggplant-shaped flask having three stop cocks, followings are dissolved in 80 ml of dry tetrahydrofuran in argon gas atmosphere.
A. 10 grams (equivalent to 0.045 mol) of TCDMA.
B. 6.43 grams (equivalent to 0.045 mol) of tert-butylmethacrylate which hereinbelow will be referred to simply as tBuMA.
C. 7.82 grams (equivalent to 0.091 mol) of MAA.
A mixture ratio of TCDMA, tBuMA and MAA was 50:25:25. To the solution was added 0.789 grams (equivalent to 0.0048 mol) of azobisisobutyronitrile, a polymerization initiator, dissolved in 30 ml of tetrahydrofuran solution, and then the solution was heated at 60–70 degrees centigrade for an hour. Then, the solution was introduced into 1 liter of hexane. Reprecipitation was twice repeated. Precipitation of polymer was collected through a filter, and then the precipitation was depressurized and dried under 2 mmHg at 40 degrees centigrade for 24 hours. Thus, there was obtained 12.4 grams of white-colored powder of poly(TCDMA-co-tBuMA-co-MAA). The yield was 51.3%. The copolymerization ratio was the same as the mixture ratio of TCDMA, tBuMA and MAA. The copolymerization ratio was measured with $^1$H-NMR. measurement process. The polystyrene equivalent molecular weight was 23100, and the degree of dispersion was 2.34. It was found from results of thermogravimetric analysis (TGA) and differential scanning calorimeter analysis (DSC) that the resin was thermally stable because the resin was not observed to thermally change at 200 degrees centigrade or lower.
IR (KBr tablet, cm$^{-1}$) 1721 ($v_{c=o}$)

| Elemental Analysis | C | H |
|---|---|---|
| measured value | 72.20 | 9.37 |
| theoretical value | 71.83 | 9.04 |

[Embodiment 3]

Synthesis of Poly(norbornaneepoxymethacrylate-co-tetrahydropyranylmethacrylate-co-methacrylic acid)

In 300 ml eggplant-shaped flask having three stop cocks, followings are dissolved in 80 ml of dry tetrahydrofuran in argon gas atmosphere.
A. 13.83 grams (equivalent to 0.077 mol) of norbornaneepoxymethacrylate which hereinbelow will be referred to simply as NEMA. NEMA was synthesized in accordance with the method disclosed in Japanese Unexamined Patent Public Disclosure No. 5-247135.
B. 13.03 grams (equivalent to 0.077 mol) of THPMA.
C. 1.47 grams (equivalent to 0.017 mol) of MAA.
A mixture ratio of TCDMA, NEMA and MAA was 45:45:10. To the solution was added 0.918 grams (equivalent to 0.0056 mol) of azobisisobutyronitrile, a polymerization initiator, dissolved in 30 ml of tetrahydrofuran solution, and then the solution was heated at 60–70 degrees centigrade for an hour. Then, the solution was introduced into 1 liter of hexane. Reprecipitation was twice repeated. Precipitation of polymer was collected through a filter, and then the precipitation was depressurized and dried under 2 mmHg at 40 degrees centigrade for 24 hours. Thus, there was obtained 15.15 grams of white-colored powder of poly(TCDMA-co-NEMA-co-MAA). The yield was 53.5%. The copolymerization ratio was the same as the mixture ratio of TCDMA, THPMA and MAA. The copolymerization ratio was measured with $^1$H-NMR. measurement process. The polystyrene equivalent molecular weight was 33200, and the degree of dispersion was 2.58. IR (KBr tablet, cm$^{-1}$) 1721 ($v_{c=o}$)

| Elemental Analysis | C | H |
|---|---|---|
| measured value | 69.90 | 8.99 |
| theoretical value | 67.92 | 8.74 |

Figure 1B:
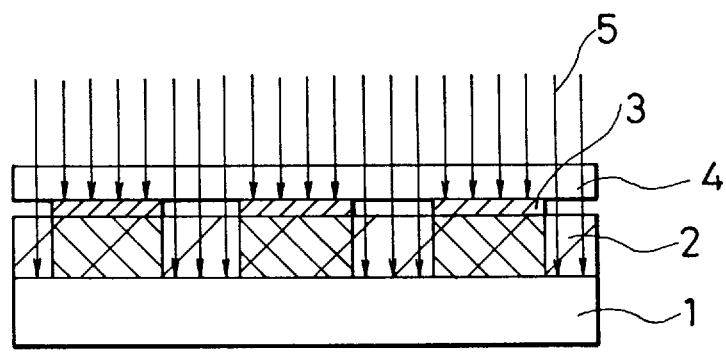
Figure 1C:
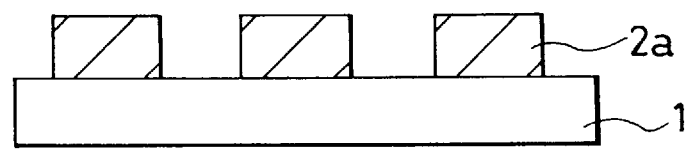
Figure 2:
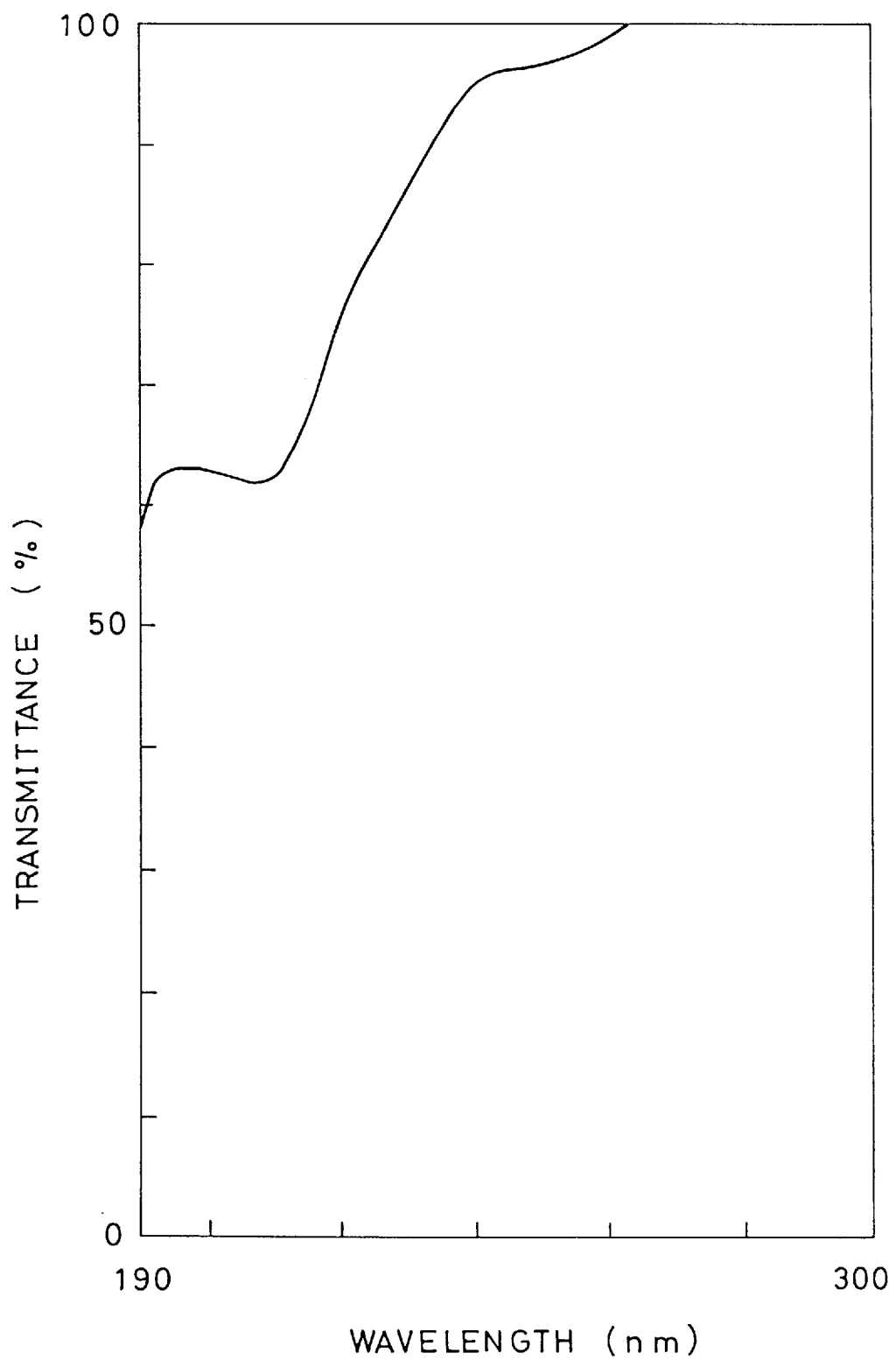
FIG. 2 is a graph showing the result of measuring a transmittance of a resist layer 0.7 μm thick shown in the fourth embodiment.

[Embodiment 4]
There was prepared a resist composed of the following materials A, B and C. The experiments mentioned later were carried out under a yellow lamp.
A. 0.950 grams of poly(TCDMA-co-THPMA-co-MAA)
This is a polymer synthesized in the first embodiment. A copolymerization ratio of TCDMA, THPMA and MAA was 45:45:10.
B. 0.050 grams of cyclohexylmethyl(2-oxocyclohexyl) sulfonium trifluoromethanesulfonate
This is a photo acid generator shown with the formula (II).
C. 4.000 grams of propyleneglycolmonomethyletheracetate
This is a solvent.
The mixture composed of the above mentioned materials A, B and C was filtrated with 0.2 µm teflon filter to thereby prepare a resist. Hereinbelow will be explained a method for forming a pattern with reference to FIGS. 1A, 1B and 1C. On a silicon substrate 1 having a thickness of 3 inches the thus prepared resist was applied with spin coating process, and then the resist was baked at 90 degrees centigrade for 60 seconds on a hot plate. Thus, on the substrate 1 was formed a thin layer 2 having a thickness of 0.7 µm, as illustrated in FIG. 1A. The dependency of a transmittance of the thin layer 2 on a wavelength was measured by use of a spectrophotometer for ultraviolet and visible region The result is shown in FIG. 2. The transmittance of the thin layer 2 at 193.4 nm was approximately 73.0% which is a sufficient transparency as a single layer resist.

Figure 3:
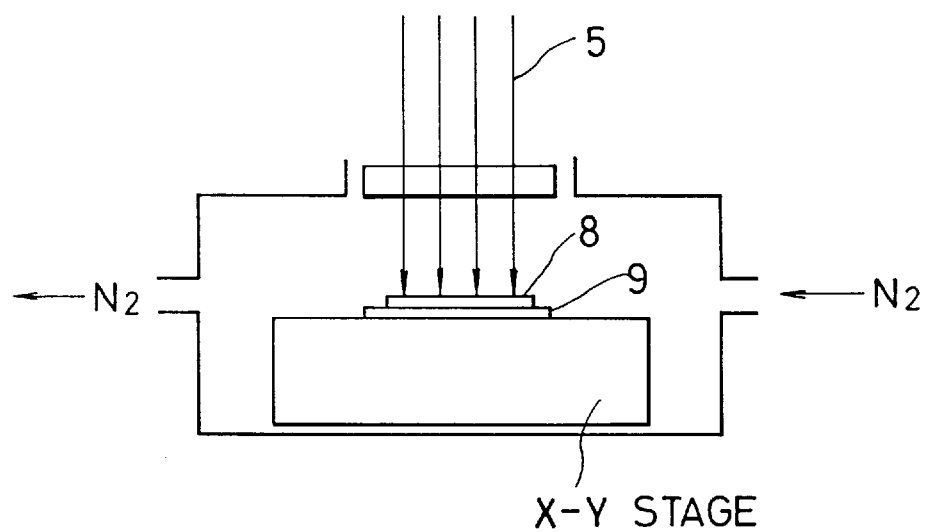
FIG. 3 is a schematic view illustrating an exposer apparatus used in an exposure experiment in the fifth, seventh and eighth embodiments.
Figure 4:
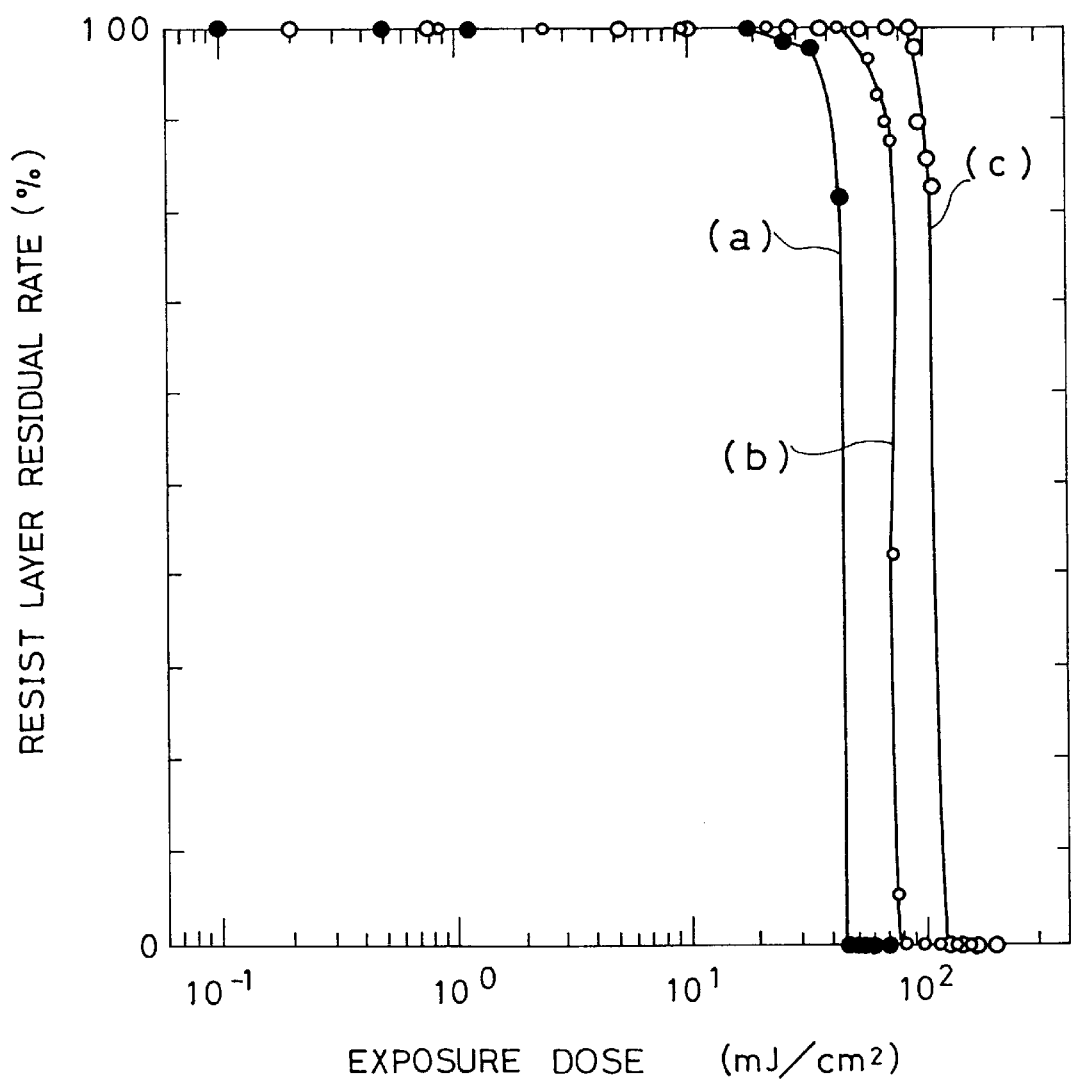
FIG. 4 shows sensitivity curves of resists shown in the fifth, seventh and eighth embodiments.

[Embodiment 5]
As illustrated in FIG. 3, a wafer 9 having a layer composed of the resist shown in the fourth embodiment was placed in an exposure apparatus sufficiently purged with nitrogen. On the resist layer 2 was closely placed a mask 8 comprising a quartz plate 4 on which a pattern 3 composed of chrome is formed, and then, as illustrated in FIG. 1B, ArF excimer laser 5 was radiated to the resist layer 2 through the mask 8. Shortly after that, the wafer 9 was baked on a hot plate at 90 degrees centigrade for 60 seconds, and then was developed by dipping for 60 seconds in an alkaline developing reagent maintained at 23 degrees. Subsequently, the wafer 9 was rinsed in pure water for 60 seconds. As a result, only an exposed region of the resist layer 2 was dissolved and removed in the developing reagent, thereby there was obtained a positive type pattern 2a, as illustrated in FIG. 1C. In this experiment, a resolution of 0.25 μm line and space was obtained when the exposure energy was approximately 47.3 mJ/cm². A sensitivity curve of the resist is shown in FIG. 4 with an indication (a). The resolved pattern was also observed with a scanning electron microscope (SEM) commercially available from Hitachi Co. Ltd,. under the tradename of SE-4100 with the result that unexposed region and peel of the pattern were not observed. Thus, it was confirmed that there was obtained a rectangularly shaped pattern.

[Embodiment 6]

In his embodiment, there was used a solution as a developing reagent, which solution is composed of a mixture of ethyl acetate and isoamyl acetate mixed at a volume ratio of 1:9, in place of the alkaline developing reagent used in the fifth embodiment. The temperature of the reagent was 23 degrees centigrade. The resist layer was developed in the developing reagent for 60 seconds, and then was rinsed with n-hexane for 20 seconds. As a result, only unexposed region of the resist layer was dissolved and removed in the developing reagent, thereby there was obtained a negative type pattern. There was obtained a resolution of 0.4 μm line and space when the exposure energy was approximately 78.5 mJ/cm². When there was used a developing reagent, which solution was composed of a mixture of methylisobutylketone and isopropylalcohol mixed at a volume ratio of 3:1, a negative type pattern was also obtained. Similarly to the fifth embodiment, there was not observed unexposed regions and peel of the pattern.

[Embodiment 7]

There was prepared a resist composed of the following materials A, B and C. The experiments mentioned later were carried out under a yellow lamp.
A. 0.920 grams of poly(TCDMA-co-tBuMA-co-MAA)
This is a polymer synthesized in the first embodiment. A copolymerization ratio of TCDMA, THPMA and MAA was 50:25:25.
B. 0.080 grams of N-hydroxysuccinimidetrifluoromethanesulfonate
This is a photo acid generator shown with the formula (III). This was synthesized with a method suggested by T. M. Chapman et al. in Synthesis, 1971, Vol. 1971, page 591.
C. 5.667 grams of propyleneglycolmonomethyletheracetate
This is a solvent.

A resist composed of the above mentioned materials A, B and C was prepared by the same method as the fourth embodiment. Then, on the substrate 1 was formed a thin layer 2 having a thickness of 0.7 μm, as illustrated in FIG. 1A. The dependency of a transmittance of the thin layer 2 on a wavelength was measured by use of a spectrophotometer for ultraviolet and visible region. The result is shown in FIG. 2. The transmittance of the thin layer 2 at 193.4 nm was approximately 73.2% which is a sufficient transparency as a single layer resist.

The experiment of resolving a pattern with ArF excimer laser was carried out using the thus formed resist layer in the same way as the fifth embodiment. Shortly after being exposed, the wafer 9 was baked on a hot plate at 120 degrees centigrade for 90 seconds, and then was developed by dipping for 90 seconds in an alkaline developing reagent maintained at 23 degrees. The alkaline developing reagent was an aqueous solution containing tetramethylammoniumhydrooxide at 5% by weight. Subsequently, the wafer 9 was rinsed in pure water for 60 seconds. As a result, only an exposed region of the resist layer 2 was dissolved and removed in the developing reagent, thereby there was obtained a positive type pattern 2a, as illustrated in FIG. 1C. In this experiment, a resolution of 0.35 μm line and space was obtained when the exposure energy was approximately 123.3 mJ/cm². A sensitivity curve of the resist is shown in FIG. 4 with an indication (b).

[Embodiment 8]

There was prepared a resist composed of the following materials A, B and C. The experiments mentioned later were carried out under a yellow lamp.
A. 0.950 grams of poly(TCDMA-co-NEMA-co-MAA)
This is a polymer synthesized in the third embodiment. A copolymerization ratio of TCDMA, NEMA and MAA was 45:45:10.
B. 0.050 grams of cyclohexylmethyl(2-oxocyclohexyl) sulfonium trifluoromethanesulfonate
This is a photo acid generator shown with the formula (II).
C. 4.882 grams of propyleneglycolmonomethyletheracetate
This is a solvent.

A resist composed of the above mentioned materials A, B and C was prepared by the same method as the fourth embodiment. Then, on the substrate 1 was formed a tin layer 2 having a thickness of 0.7 μm, as illustrated in FIG. 1A. The dependency of a transmittance of the thin layer 2 on a wavelength was measured by use of a spectrophotometer for ultraviolet and visible region. The result is shown in FIG. 2. The transmittance of the thin layer 2 at 193.4 nm was approximately 68.7% which is a sufficient transparency as a single layer resist.

The experiment of resolving a pattern with ArF excimer laser was carried out using the thus formed resist layer in the same way as the fifth embodiment. Shortly after being exposed, the wafer 9 was baked on a hot plate at 85 degrees centigrade for 60 seconds, and then was developed by dipping for 60 seconds in an alkaline developing reagent maintained at 23 degrees. The alkaline developing reagent was an aqueous solution containing tetramethylammoniumhydrooxide at 2.38% by weight and methylethyl ketone at 5% by weight. Subsequently, the wafer 9 was rinsed in pure water for 60 seconds. As a result, only an exposed region of the resist layer 2 was dissolved and removed in the developing reagent, thereby there was obtained a positive type pattern 2a, as illustrated in FIG. 1C. In this experiment, a resolution of 0.3 μm line and space was obtained when the exposure energy was approximately 76.0 mJ/cm². A sensitivity curve of the resist is shown in FIG. 4 with an indication (c).

[Embodiment 9]

The resist layer shown in the eighth embodiment was etched with an etching apparatus commercially available from Nichiden Aneruba under the tradename of DEM 451. The etching was carried out under the conditions that the used gas was $CF_4$, the power was 100 W, 30 sccm, and the pressure was 5 Pa. The etching speed was 203.3 Å/min. As a result, it was confirmed that the resist had a high dry-etch resistance. Furthermore, the patterned wafer in the fifth embodiment was etched in the same way as the above mentioned way except that the used gas was a mixture of $CF_4$ and $H_2$ mixed at 3:1. Only regions where the pattern is not present and thus the wafer is exposed were etched without damaging the shape of the resist.

As having been explained in connection with the embodiment, the photosensitive resin in accordance with the invention has a high transparency in far ultraviolet radiation band having a wavelength not longer than 220 nm, and further has a high sensitivity and resolution to far ultraviolet radiation. The photosensitive resin is suitable for forming photoresist using far ultraviolet radiation having a wavelength equal to or shorter than 220 nm, in particular ArF excimer laser, as an exposure light. In addition, the photosensitive resin in accordance with the invention makes it possible to from a minute pattern which is necessary for manufacturing a semiconductor element.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method for patterning a substrate, said method comprising the steps of:

(1) forming a thin film on a substrate, said thin film being composed of a photosensitive resin comprising:
      (A) a polymer including a group which reacts with an acid to convert polarity of the polymer;
      (B) a photo acid generator which is responsive to radiation to generate an acid; and
      (C) a solvent in which said polymer and said photo acid generator are soluble,
      said polymer being a terpolymer represented by general formula (I)

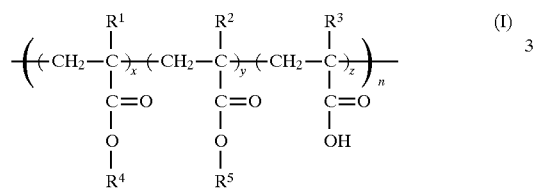

wherein n represents a positive integer ranging from 5 to 1000 both inclusive, $R^1$, $R^2$ and $R^3$ each represents a hydrogen atom or a methyl group, $R^4$ is selected from the group consisting of a tricyclodecyl group, a dicyclopentenyl group, a dicyclopentenyloxyethyl group, a norbornaneepoxy group, and a norbornaneepoxymethyl group, $R^5$ is selected from the group consisting of a tetrahydropyranyl group, a tetrahydrofuranyl group, a methyl group, an ethyl group, a propyl group, a tert-butyl group and a 3-oxocyclohexyl group, and x+y+z=1 in which x is from 0.1 to 0.9 both inclusive, y is from 0.1 to 0.7 both inclusive, and z is from 0.01 to 0.7 both inclusive;

(2) exposing a selected region of said thin film to light having a wavelength equal to or less than 220 nm;

(3) heating said thin film; and (4) developing said selected region of said thin film.

2. The method as recited in claim 1, wherein said light for exposure is ArF excimer laser light.

3. The method as recited in claim 1, wherein said polymer has a polystyrene equivalent molecular weight (Mw) in the range of 8000 to 20000 both inclusive.

4. The method as recited in claim 1, wherein said photo acid generator is contained by weight percent in the range from 0.5 to 25 both inclusive.

* * * * *

UNITED STATES PATENT AND TRADEMARK OFFICE
CERTIFICATE OF CORRECTION

PATENT NO. : 5,866,304
DATED : February 2, 1999
INVENTOR(S) : Kaichiro NAKANO et al.

It is certified that error appears in the above-identified patent and that said Letters Patent is hereby corrected as shown below:

Column 6, lines 53 and 54, change all "-" to superscripts --"-"--.

Column 14, line 22, delete "tin: and insert --thin--.

Signed and Sealed this

Third Day of August, 1999

Attest:

Q. TODD DICKINSON

Attesting Officer

Acting Commissioner of Patents and Trademarks